(12) United States Patent
Pannese

(10) Patent No.: US 11,823,933 B2
(45) Date of Patent: Nov. 21, 2023

(54) INDEXABLE SIDE STORAGE POD APPARATUS, HEATED SIDE STORAGE POD APPARATUS, SYSTEMS, AND METHODS

(71) Applicant: Applied Materials, Inc., Santa Clara, CA (US)

(72) Inventor: Patrick Pannese, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1 day.

(21) Appl. No.: 17/521,769

(22) Filed: Nov. 8, 2021

(65) Prior Publication Data

US 2022/0068686 A1 Mar. 3, 2022

Related U.S. Application Data

(63) Continuation of application No. 15/989,752, filed on May 25, 2018, now Pat. No. 11,171,028.

(Continued)

(51) Int. Cl.
  *H01L 21/677* (2006.01)
  *H01L 21/673* (2006.01)
  *H01L 21/687* (2006.01)

(52) U.S. Cl.
  CPC .. *H01L 21/67769* (2013.01); *H01L 21/67386* (2013.01); *H01L 21/67389* (2013.01);
  (Continued)

(58) Field of Classification Search
  CPC ......... H01L 21/68714; H01L 21/67796; H01L 21/67028; H01L 21/67393; H01L 21/67389
  (Continued)

(56) References Cited

U.S. PATENT DOCUMENTS 6,199,604 B1 3/2001 Miyajima
6,955,197 B2 10/2005 Rice
(Continued)

FOREIGN PATENT DOCUMENTS

JP 2015162532 A 9/2015
KR 10-20170037294 A 4/2017
WO 2009114798 A2 9/2009

OTHER PUBLICATIONS

Taiwan Search Report of Taiwan Application No. 107118077 (25135-TW) dated Mar. 6, 2019.
(Continued)

*Primary Examiner* — Saul Rodriguez
*Assistant Examiner* — Willie W Berry, Jr.
(74) *Attorney, Agent, or Firm* — Lowenstein Sandler LLP

(57) ABSTRACT

A side storage pod includes an outer enclosure having a sealing surface configured to couple to an EFEM and a side storage pod chamber having a body coupled to vertically-spaced storage members. Each of the vertically-spaced storage members is configured to support a corresponding substrate within the body. The side storage pod further includes a removable door. The removable door and the body are to seal relative to each other responsive to the removable door being in a closed position. A load-unload robot of the EFEM is to access the vertically-spaced storage members responsive to the removable door being in an open position. An environment within the side storage pod chamber is to be controlled to be one or more of: at first environmental conditions responsive to the removable door being in the closed position; or at second environmental conditions responsive to the removable door being in the open position.

24 Claims, 10 Drawing Sheets

Related U.S. Application Data

(60) Provisional application No. 62/524,375, filed on Jun. 23, 2017.

(52) U.S. Cl.
CPC .. *H01L 21/67393* (2013.01); *H01L 21/67772* (2013.01); *H01L 21/67775* (2013.01); *H01L 21/67778* (2013.01); *H01L 21/68707* (2013.01)

(58) Field of Classification Search
USPC .......................................................... 414/217
See application file for complete search history.

(56) References Cited

U.S. PATENT DOCUMENTS

| | | |
|---|---|---|
| 8,382,088 B2 | 2/2013 | Kondoh |
| 8,395,136 B2 | 3/2013 | Kondoh |
| 9,105,673 B2 | 8/2015 | Babbs et al. |
| 10,431,481 B2 | 10/2019 | Wakabayashi |
| 2004/0046924 A1 | 3/2004 | Kim et al. |
| 2006/0207680 A1 | 9/2006 | Takamura |
| 2007/0051312 A1 | 3/2007 | Sneh |
| 2008/0056860 A1 | 3/2008 | Natume |
| 2008/0236487 A1 | 10/2008 | Hirano et al. |
| 2010/0040441 A1 | 2/2010 | Obikane |
| 2010/0102030 A1 | 4/2010 | Kondoh |
| 2010/0178147 A1 | 7/2010 | Kremerman et al. |
| 2010/0182586 A1 | 7/2010 | Ogura |
| 2010/0190343 A1 | 7/2010 | Aggarwal et al. |
| 2012/0083918 A1 | 4/2012 | Yamazaki |
| 2012/0237323 A1 | 9/2012 | Sugawara |
| 2012/0241032 A1 | 9/2012 | Sugawara |
| 2012/0247671 A1 | 10/2012 | Sugawara |
| 2014/0048208 A1 | 2/2014 | Kim |
| 2014/0144375 A1 | 5/2014 | Kim et al. |
| 2014/0209024 A1 | 7/2014 | Kim et al. |
| 2015/0045961 A1 | 2/2015 | Koshti et al. |
| 2015/0107770 A1 | 4/2015 | Choi et al. |
| 2015/0170945 A1 | 6/2015 | Segawa et al. |
| 2015/0364346 A1 | 12/2015 | Woo |
| 2016/0013084 A1 | 1/2016 | Kamata et al. |
| 2016/0035596 A1 | 2/2016 | Kamiya |
| 2016/0049321 A1 | 2/2016 | Chen et al. |
| 2016/0118279 A1 | 4/2016 | Iyer et al. |
| 2016/0118282 A1 | 4/2016 | Maraschin et al. |
| 2016/0147235 A1 | 5/2016 | Rice et al. |
| 2016/0284580 A1 | 9/2016 | Woo et al. |
| 2016/0379855 A1 | 12/2016 | Fukasawa |
| 2017/0011942 A1 | 1/2017 | Woo et al. |
| 2017/0025290 A1 | 1/2017 | Wakabayashi |
| 2018/0114710 A1 | 4/2018 | Jeong et al. |
| 2018/0124960 A1 | 5/2018 | Vincent et al. |
| 2018/0130684 A1 | 5/2018 | Reuter et al. |
| 2018/0130685 A1 | 5/2018 | Bonecutter et al. |
| 2018/0130686 A1 | 5/2018 | Blahnik et al. |
| 2018/0130687 A1 | 5/2018 | Bonecutter |
| 2018/0226284 A1 | 8/2018 | Balhnik |
| 2018/0269095 A1 | 9/2018 | Reuter |
| 2018/0277410 A1 | 9/2018 | Woo et al. |
| 2018/0374725 A1 | 12/2018 | Holeyannavar et al. |
| 2019/0267258 A1 | 8/2019 | Rice |

OTHER PUBLICATIONS

International Search Report and Written Opinion of the International Application No. PCT/US2018/034622 (24710-WO) dated Sep. 19, 2018.

International Search Report and Written Opinion of the International Application No. PCT/US2018/034635 (25135-WO) dated Sep. 14, 2018.

Taiwan Notice of Reasons for Rejection for Application No. 2019-569826, dated Apr. 27, 2021.

Korean Office Action for Application No. Korean Patent Application No. (PCT) 10-2020-7002109, dated Apr. 30, 2021.

Final Office Action of U.S. Appl. No. 15/632,074 (25135) dated Jan. 30, 2019.

INDEXABLE SIDE STORAGE POD APPARATUS, HEATED SIDE STORAGE POD APPARATUS, SYSTEMS, AND METHODS

RELATED APPLICATION

This application is a continuation of U.S. patent application Ser. No. 15/989,752, filed May 25, 2018, which claims the benefit of U.S. Provisional Patent Application No. 62/524,375, filed on Jun. 23, 2017, the entire contents of each are incorporated by reference herein.

FIELD

The present application relates to electronic device manufacturing, and more specifically to indexable side storage pods for equipment front end modules (EFEMs), and systems and methods including same.

BACKGROUND

Processing of substrates in semiconductor component manufacturing is carried out in multiple process tools, where the substrates travel between the process tools in substrate carriers (e.g., Front Opening Unified Pods or FOUPs). The FOUPs may be docked to a front side of an EFEM that includes a load/unload robot that is operable to transfer substrates between the respective FOUPs and one or more load locks of a mainframe of a process tool. In some systems, the EFEM includes side storage that is used to store a small number of substrates that are returning from processing in the processing tool. However, existing side storage suffers from certain limitations.

Accordingly, improved side storage, systems including side storage and methods are sought.

SUMMARY

In some embodiments, a side storage pod of an equipment front end module is provided that includes (1) an outer enclosure having a sealing surface configured to couple to the equipment front end module; (2) a side storage pod chamber having a body with a plurality of vertically-spaced storage members each configured to support a substrate; and (3) an indexer operable to vertically move the side storage pod chamber so that different subgroups of storage members are accessible by a load-unload robot in the equipment front end module.

In some embodiments, an electronic device processing system is provided that includes (1) an equipment front end module including an equipment front end module chamber; (2) one or more load ports coupled to a front of the equipment front end module, each load port configured to support a substrate carrier; and (3) an indexable side storage pod coupled to a side of the equipment front end module. The indexable side storage pod includes (a) an outer enclosure having a sealing surface configured to couple to the equipment front end module; (b) a side storage pod chamber having a body with a plurality of vertically-spaced storage members each configured to support a substrate; and (c) an indexer operable to vertically move the side storage pod chamber so that different subgroups of storage members are accessible by a load-unload robot in the equipment front end module.

In some embodiments, a method of processing substrates within an electronic device processing system includes providing an electronic device processing system having (1) an equipment front end module including an equipment front end module chamber; (2) one or more load ports coupled to a front of the equipment front end module, each load port configured to support a substrate carrier; and (3) an indexable side storage pod coupled to a side of the equipment front end module. The indexable side storage pod includes (a) an outer enclosure having a sealing surface configured to couple to the equipment front end module; (b) a side storage pod chamber having a body with a plurality of vertically-spaced storage members each configured to support a substrate; and (c) an indexer operable to vertically move the side storage pod chamber so that different subgroups of storage members are accessible by a robot in the equipment front end module. The method also includes retrieving a substrate positioned on one of the storage members of the side storage pod chamber using the robot within the equipment front end module chamber, and transferring the substrate from the side storage pod chamber to the equipment front end module chamber using the robot.

In some embodiments, an electronic device processing system is provided. The electronic device processing system includes an equipment front end module including an equipment front end module chamber; one or more load ports coupled to a front of the equipment front end module, each load port configured to support a substrate carrier; and a side storage pod coupled to a side of the equipment front end module, the side storage pod including: a side storage pod chamber having a body with a plurality of vertically-spaced storage members each configured to support a substrate and an input port; and a heater coupled to the input port of the side storage pod chamber, the heater configured to provide a heated, non-reactive gas flow through the side storage pod chamber and over any substrates stored therein.

In some embodiments, a method of processing substrates within an electronic device processing system is provided. The method includes providing an electronic device processing system including: an equipment front end module including an equipment front end module chamber; one or more load ports coupled to a front of the equipment front end module, each load port configured to support a substrate carrier; a side storage pod coupled to a side of the equipment front end module, the side storage pod further including: a side storage pod chamber having a body with a plurality of vertically-spaced storage members each configured to support a substrate, and a heater coupled to the side storage pod chamber and configured to provide a heated, non-reactive gas to the side storage pod chamber; and flowing the heated, non-reactive gas through the side storage pod chamber and over any substrates stored therein.

Numerous other aspects are provided in accordance with these and other embodiments of the disclosure. Other features and aspects of embodiments of the disclosure will become more fully apparent from the following detailed description, the claims, and the accompanying drawings.

BRIEF DESCRIPTION OF THE DRAWINGS

The drawings, described below, are for illustrative purposes and are not necessarily drawn to scale. The drawings are not intended to limit the scope of the disclosure in any way.

DETAILED DESCRIPTION

Figure 1A:
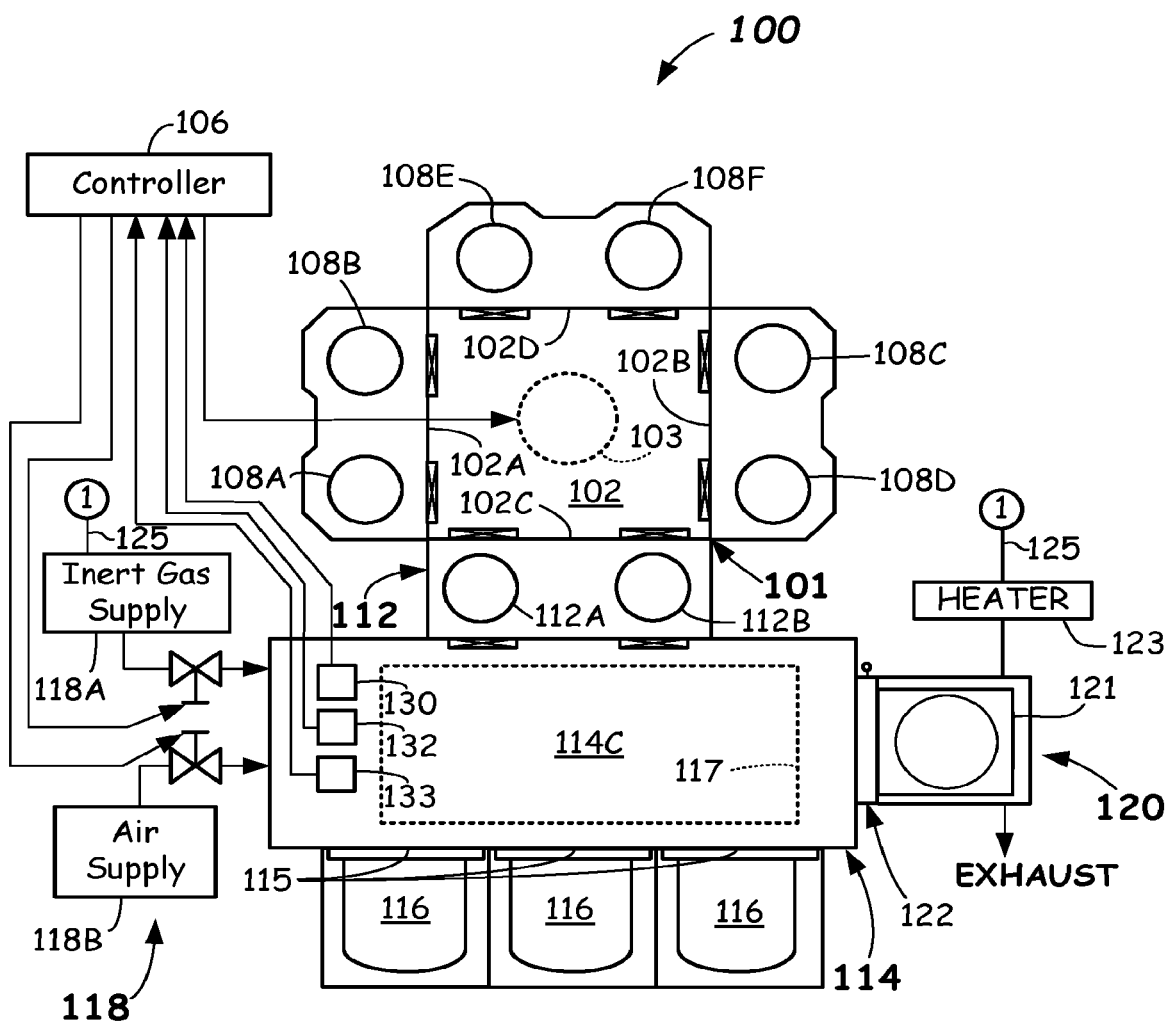
FIG. 1A illustrates a schematic top view of an electronic device processing system including an indexable side storage pod apparatus according to one or more embodiments.

Reference will now be made in detail to the example embodiments, which are illustrated in the accompanying drawings. Wherever possible, the same reference numbers will be used throughout the drawings to refer to the same or like parts. Features of the various embodiments described herein may be combined with each other, unless specifically noted otherwise.

Substrates processed in existing electronic device manufacturing systems may suffer from problems when exposed to relatively higher humidity or other environmental factors (e.g., too high of an oxygen ($O_2$) level), or relatively high levels of other chemical contaminants. In particular, exposure of substrates to relatively high humidity levels, relatively high $O_2$ levels, or other contaminants may adversely affect substrate properties in some embodiments.

According to one or more embodiments of the disclosure, electronic device processing systems adapted to provide improved substrate processing are provided. The systems and methods described herein may provide efficiency and/or processing improvements in the processing of substrates by controlling environmental conditions to which the substrates are exposed to when in transit between tools and also when interfacing with an equipment front end module (EFEM).

The EFEM receives substrates from one or more substrate carriers docked to a wall thereof (e.g., docked to a front surface thereof) and a load/unload robot delivers the substrates to one or more load locks coupled on another surface of the EFEM (e.g., a rear surface thereof). In some embodiments, one or more environmental parameters (e.g., a relative humidity, a temperature, an amount of $O_2$, an amount of an inert gas, or an amount of another chemical contaminate) are monitored and controlled, and none of the FOUPs docked to the EFEM may be opened unless certain preconditions regarding the environment in a EFEM chamber of the EFEM are met.

In one or more embodiments herein, a side storage pod is provided that may be environmentally controlled and may include supplemental and/or indexable substrate storage for the EFEM. For example, in some embodiments, the side storage pod may include a side storage pod chamber that allow storage of 50 or more (e.g., 52 or more), and in some embodiments 75 or more, substrates. In one or more embodiments, a heated, non-reactive gas such as nitrogen may be provided to the side storage pod chamber so that any substrates stored therein may be exposed to a non-reactive environment and/or degassed. The side storage pod chamber may include its own input and exhaust ports so that a heated, non-reactive gas may flow through the side storage pod chamber, over any substrates stored therein, and out of the side storage pod chamber. This allows any volatile byproducts present within the side storage pod chamber or located on substrates stored with the side storage pod chamber to be removed using one or more pump/purge cycles, and may reduce cross contamination between the side storage pod chamber and the EFEM during substrate transfers therebetween.

In some embodiments, the side storage pod chamber may be sealed and removed from the side storage pod for use at another processing location. Another side storage pod chamber may then be loaded into the side storage pod and used to transfer substrates to and/or receive substrates from the EFEM. In this manner, an unlimited amount of substrate storage may be provided to the EFEM through the use of additional side storage pod chambers.

The environment within the EFEM may be controlled, as well. In short, the environment to which substrates are exposed is controlled, cradle to grave, all along their transport paths and/or during substrate storage.

Further details of example apparatus, system, and method embodiments provided herein are described with reference to FIGS. 1A-4 below.

FIG. 1A is a schematic diagram of an example embodiment of an electronic device processing system 100 according to one or more embodiments of the present disclosure. The electronic device processing system 100 may include a mainframe housing 101 having housing walls defining a transfer chamber 102. A transfer robot 103 (shown as a dotted circle) may be at least partially housed within the transfer chamber 102. The transfer robot 103 may be configured to place and extract substrates to and from destinations via operation of arms (not shown) of the transfer robot 103. Substrates as used herein include articles used to make electronic devices or circuit components, such as semiconductor wafers, silicon-containing wafers, patterned wafers, glass plates, or the like.

The motion of the various arm components of the transfer robot 103 may be controlled by suitable commands to a drive assembly (not shown) containing a plurality of drive motors of the transfer robot 103 as commanded from a controller 106. Signals from the controller 106 may cause motion of the various components of the transfer robot 103. Suitable feedback mechanisms may be provided for one or more of the components by various sensors, such as position encoders, or the like.

The transfer robot 103 may include arms rotatable about a shoulder axis, which may be approximately centrally located in the transfer chamber 102. Transfer robot 103 may include a base (not shown) that is configured to be attached to a housing wall (e.g., a floor) forming a lower portion of the transfer chamber 102. However, the transfer robot 103 may be attached to a ceiling in some embodiments. The transfer robot 103 may be a dual-type robot configured to service twin chambers (e.g., side-by-side chambers) when the processing tool includes twinned-process chambers (as shown). Other types of process chamber orientations, as well as other types of transfer robots may be used.

The transfer chamber 102 in the depicted embodiment may be square or slightly rectangular in shape, for example, and may include a first facet 102A, second facet 102B opposite the first facet 102A, a third facet 102C, and a fourth facet 102D opposite the third facet 102C. The transfer robot 103 may be adept at transferring and/or retracting dual substrates at a same time into the chamber sets. The first facet 102A, second facet 102B, a third facet 102C, and fourth facet 102D may be planar, for example, and entryways into the chamber sets may lie along the respective facets. However, other suitable shapes of the mainframe housing 101 and numbers of facets and processing chambers are possible.

The destinations for the transfer robot 103 may be a first process chamber set 108A, 108B, coupled to the first facet 102A and which may be configured and operable to carry out a process on the substrates delivered thereto. The process may be any suitable process such as plasma vapor deposition (PVD) or chemical vapor deposition (CVD), etch, annealing, pre-clean, metal or metal oxide removal, or the like. Other processes may be carried out on substrates therein.

The destinations for the transfer robot 103 may also be a second process chamber set 108C, 108D that may be opposed from the first process chamber set 108A, 108B. The second process chamber set 108C, 108D may be coupled to the second facet 102B and may be configured to carry out any suitable process on the substrates, such as any of the processes mentioned above. Likewise, the destinations for the transfer robot 103 may also be a third process chamber set 108E, 108F that may be opposed from a load lock apparatus 112 coupled to the third facet 102C. The third process chamber set 108E, 108F may be configured to carry out any suitable process on the substrates, such as any of the processes mentioned above.

Substrates may be received into the transfer chamber 102 from an EFEM 114, and also exit the transfer chamber 102, to the EFEM 114, through the load lock apparatus 112 that is coupled to a surface (e.g., a rear wall) of the EFEM 114. The load lock apparatus 112 may include one or more load lock chambers (e.g., load lock chambers 112A, 112B, for example). Load lock chambers 112A, 112B that are included in the load lock apparatus 112 may be single wafer load locks (SWLL) chambers, multi-wafer chambers, or combinations thereof.

The EFEM 114 may be any enclosure having sidewall surfaces (such as front, rear, and side walls, a top, and a bottom, for example) forming an EFEM chamber 114C. One or more load ports 115 may be provided on surfaces (e.g., front surfaces) of the EFEM 114 and may be configured to receive one or more substrate carriers 116 (e.g., FOUPs) thereat. Three substrate carriers 116 are shown, but more or less numbers of substrate carriers 116 may be docked with the EFEM 114.

EFEM 114 may include a suitable load/unload robot 117 (shown dotted) of conventional construction within the EFEM chamber 114C thereof. The load/unload robot 117 may be configured and operational, once a door of a substrate carrier 116 is opened, to extract substrates from the substrate carrier 116 and feed the substrates through the EFEM chamber 114C and into the one or more load lock chambers 112A, 112B of the load lock apparatus 112. Optionally, the load/unload robot 117 may be configured and operational, once the doors of a substrate carrier 116 is opened, to extract substrates from the substrate carrier 116 and feed the substrates into a side storage pod 120 while the substrates sit idle awaiting processing. The side storage pod 120 is coupled to a side wall of the EFEM 114. The load/unload robot 117 may further be configured to extract substrates from and load substrates into the side storage pod 120 prior to and after processing in one or more of the process chambers 108A-108F.

The side storage pod 120 may be environmentally controlled and include supplemental and/or indexable substrate storage for the EFEM 114. For example, in some embodiments, the side storage pod 120 may include a side storage pod chamber 121 that allow storage of 50 or more (e.g., 52 or more), and in some embodiments 75 or more, substrates. Substrates may be transferred from the side storage pod chamber 121 to EFEM 114, and vice versa, by opening a sealable door 122 of the side storage pod chamber 121 to provide access to the side storage pod chamber 121. In one or more embodiments, a heated, non-reactive gas such as nitrogen may be supplied, via heater 123, for example, to the side storage pod chamber 121 so that any substrates stored therein may be exposed to a non-reactive environment and/or degassed. The side storage pod chamber 121 may include its own input and exhaust ports (described below) so that a heated, non-reactive gas may flow through the side storage pod chamber 121, over any substrates stored therein, and out of the side storage pod chamber 121 to an exhaust. Example embodiments of the side storage pod 120 and side storage pod chamber 121 are described further below with reference to FIGS. 2A-2F.

Any suitable construction of the load lock apparatus 112 allowing transfer of substrates between the transfer chamber 102 and the EFEM chamber 114C may be used.

In the depicted embodiment, the EFEM chamber 114C may be provided with environmental controls providing an environmentally-controlled atmosphere therein. In particular, an environmental control system 118 is coupled to the EFEM 114 and is operational to monitor and/or control environmental conditions within the EFEM chamber 114C. In some embodiments, and at certain times, the EFEM chamber 114C may receive an inert and/or non-reactive gas therein, such as Argon (Ar), Nitrogen ($N_2$), or helium (He), from an inert gas supply 118A. In other embodiments, or at other times, air (e.g., dry filtered air) may be provided from an air supply 118B. In some embodiments described below with reference to FIGS. 2A-2F, the environmental conditions within the EFEM chamber 114C may be present in the interior of the side storage pod 120 as the EFEM chamber 114C and the side storage pod 120 may be open to one another and/or otherwise in fluid communication. The side storage pod chamber 121 may have a separately controlled environment supplied from inert gas supply 118A or another gas source (not shown).

In more detail, the environmental control system 118 may control at least one of: 1) relative humidity (RH), 2) temperature (T), 3) an amount of $O_2$, or 4) an amount of inert and/or non-reactive gas, within the EFEM chamber 114C, side storage pod 120 and/or side storage pod chamber 121. Other environmental conditions of the EFEM 114, side storage pod 120 and/or side storage pod chamber 121 may be monitored and/or controlled, such as gas flow rate into the EFEM chamber 114C, side storage pod 120 and/or side storage pod chamber 121 or pressure in the EFEM chamber 114C, side storage pod 120 and/or side storage pod chamber 121 or both.

In some embodiments, environmental control system 118 includes the controller 106. Controller 106 may include suitable processor, memory, and/or electronic components for receiving inputs from various sensors and controlling one or more valves to control the environmental conditions within the EFEM chamber 114C, side storage pod 120 and/or side storage pod chamber 121. Environmental control system 118 may, in one or more embodiments, monitor relative humidity (RH) by sensing RH in the EFEM 114C with a relative humidity sensor 130 that is configured to sense relative humidity (RH). Any suitable type of relative humidity sensor 130 may be used, such as a capacitive-type sensor. Relative humidity in the side storage pod 120 and/or side storage pod chamber 121 also may be monitored. The RH may be lowered by flowing a suitable amount of an inert and/or non-reactive gas from the inert gas supply 118A of the environmental control system 118 into the EFEM chamber 114C, side storage pod 120 and/or side storage pod chamber 121. As described herein, the inert and/or non-reactive gas from the inert gas supply 118A may be argon, $N_2$, helium, another non-reactive gas, or mixtures thereof. Compressed bulk inert gases having low $H_2O$ levels (e.g., purity>=99.9995%, $H_2O$<5 ppm) may be used as the inert gas supply 118A in the environmental control system 118, for example. Other $H_2O$ levels may be used.

In one or more embodiments, the pre-defined reference relative humidity value may be less than about 1000 ppm moisture, less than about 500 ppm moisture, or even less than about 100 ppm moisture, depending upon the level of moisture that is tolerable for the particular process being carried out in the electronic device processing system 100 or particular substrates exposed to the environment of the EFEM 114, side storage pod 120 and/or side storage pod chamber 121.

The environmental control system 118 may include an oxygen sensor 132 that is configured and adapted to sense a level of oxygen ($O_2$) within the EFEM 114. Oxygen level in the side storage pod 120 and/or side storage pod chamber 121 also may be monitored. In some embodiments, a control signal from the controller 106 to the environmental control system 118 initiating a flow of a suitable amount of an inert and/or non-reactive gas from the inert gas supply 118A into the EFEM chamber 114C, side storage pod 120 and/or side storage pod chamber 121 may take place to control the level of oxygen ($O_2$) to below a threshold $O_2$ value. In one or more embodiments, the threshold $O_2$ value may be less than about 50 ppm of $O_2$, less than about 10 ppm of $O_2$, or even less than about 5 ppm of $O_2$, depending upon the level of $O_2$ that is tolerable (not affecting quality) for the particular process being carried out in the electronic device processing system 100 or particular substrates exposed to the environment of the EFEM 114, side storage pod 120 and/or side storage pod chamber 121. Other threshold $O_2$ values may be used.

The environmental control system 118 may further include a pressure sensor 133 that measures the absolute or relative pressure within the EFEM 114. Pressure level in the side storage pod 120 and/or side storage pod chamber 121 also may be monitored. In some embodiments, the controller 106 may control the amount of flow of an inert and/or non-reactive gas from the inert gas supply 118A into the EFEM chamber 114C, side storage pod 120 and/or side storage pod chamber 121 to control the pressure in the EFEM chamber 114C, side storage pod 120 and/or side storage pod chamber 121. In some embodiments, the oxygen sensor 132 may sense the level of oxygen in the EFEM chamber 114C to ensure it is above a safe threshold level to allow entry into the EFEM chamber 114C (e.g., during maintenance).

In the depicted embodiments herein, the controller 106 may be any suitable controller having suitable processor, memory, and peripheral components adapted to receive control inputs from the various sensors (e.g., relative humidity sensor 130 and/or oxygen sensor 132) and execute a closed loop or other suitable control scheme. In one embodiment, the control scheme may change a flow rate of a gas being introduced into the EFEM 114, side storage pod 120 and/or side storage pod chamber 121 to achieve a predefined environmental condition therein. In another embodiment, the control scheme may determine when to transfer substrates into the EFEM 114 and/or side storage pod chamber 121. In some embodiments, the side storage pod chamber 121 may use a separate controller and/or sensors to monitor and control the environment within the side storage pod chamber 121.

The side storage pod 120 attached to the EFEM 114 may store substrates under specific environmental conditions. For example, the side storage pod chamber 121 may store the substrates in the same environmental conditions as are present in the EFEM chamber 114C. Alternatively, the side storage pod chamber 121 may employ environmental conditions that are different than that of the EFEM chamber 114C for substrate storage (e.g., lower oxygen and/or contamination levels, higher temperature, higher pressure, etc.).

The side storage pod 120 may be fluidly coupled to the EFEM chamber 114C and may receive inert and/or non-reactive gas from the EFEM 114. The side storage pod 120 may include exhaust conduits (not shown) to exhaust gas from the side storage pod 120.

In the depicted embodiment, the environmental control system 118 may provide a flow of inert and/or non-reactive gas to the side storage pod chamber 121. As described, inert gas supply 118A may supply an inert and/or non-reactive gas to side storage pod chamber 121 through one or more supply conduits 125 and valves (not shown) coupled thereto. The one or more supply conduits 125 and valves supply inert and/or non-reactive gas to the side storage pod chamber 121 at certain times responsive to control signals from the controller 106 (or a separate dedicated controller). For example, the supply of inert and/or non-reactive gas may be provided to side storage pod chamber 121 just prior to opening sealable door 122 of side storage pod chamber 121 in order to purge the environment within the side storage pod chamber 121 to meet certain environmental preconditions. Such environmental preconditions may be met before opening door 122 allowing the transfer of substrates to or from the side storage pod chamber 121 via the EFEM chamber 114C. Likewise, during substrate storage within the side storage pod chamber 121, low oxygen gas, heated gas, or the like may be provided to the side storage pod chamber 121. As stated, in some embodiments, substrates being stored in the side storage pod chamber 121 may be exposed to a different environment than the environment present in the EFEM 114.

Figure 1B:
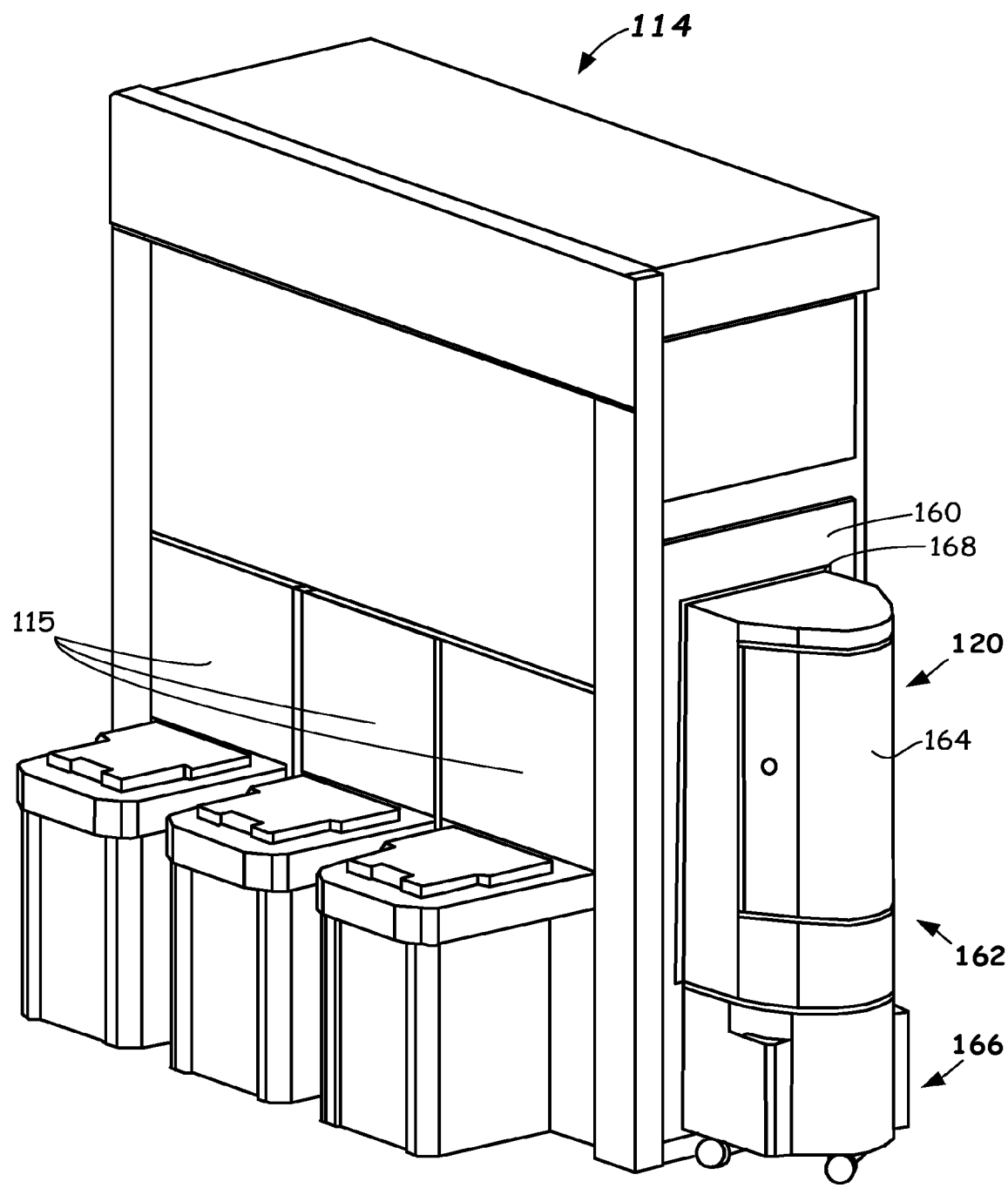
FIG. 1B illustrates a front perspective view of an equipment front end module including an indexable side storage pod apparatus according to one or more embodiments.

FIG. 1B is a perspective view of the EFEM 114 having load ports 115 and the side storage pod 120 coupled thereto. The side storage pod 120 may be sealingly coupled to a sidewall panel 160 of the EFEM 114 to form an airtight and/or vacuum seal between the EFEM 114 and the side storage pod 120. Any suitable seal may be used (e.g., o-rings, rectangular seals, extruded bulb seals, ethylene propylene diene monomer seals, fluoroelastomer seals, or the like).

As shown in FIG. 1B, the side storage pod 120 may include an upper region 162 in which a side storage pod chamber 121 may be loaded into or removed from (e.g., through a side storage pod access door 164). The side storage pod 120 also includes a lower region 166 that supports the upper region 162 of the side storage pod 120, and which may include various valves, plumbing, exhaust, etc., for the side storage pod 120 and/or side storage pod chamber 121 as described further below. The side storage pod 120 may include a sealing surface 168 configured to seal against the sidewall panel 160 of the EFEM 114.

Figure 2A:
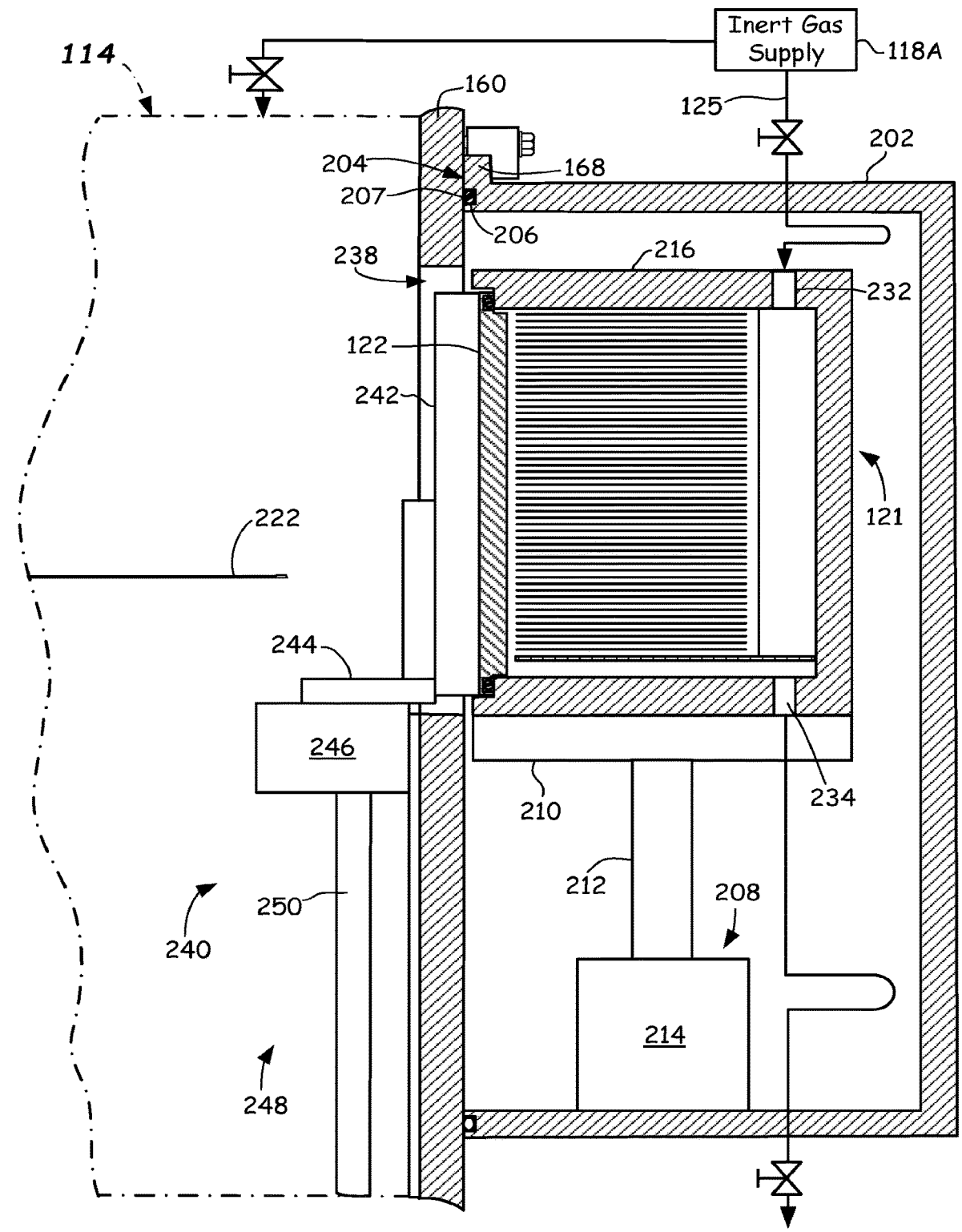
FIGS. 2A-2F illustrate partial side views of an indexable side storage pod apparatus according to one or more embodiments.

FIG. 2A is side, partial cross-sectional view of the side storage pod 120 in accordance with one more embodiments provide herein. The side storage pod 120 includes an outer enclosure 202 having the sealing surface 168 configured to seal against the sidewall panel 160 of EFEM 114. In some embodiments, sealing surface 168 may have a back surface 204 that has a groove 206 extending around a portion and/or a periphery of sealing surface 168. A seal 207 may be seated in groove 206 and seal the interface between side storage pod 120 and EFEM 114 when side storage pod 120 and EFEM 114 are coupled together. Any suitable seal may be used (e.g., o-rings, rectangular seals, extruded bulb seals, ethylene propylene diene monomer seals, fluoroelastomer seals, or the like).

The side storage pod chamber 121 is positioned within the outer enclosure 202 and is coupled to an indexer 208. In some embodiments, side storage pod chamber 121 may be positioned on a pedestal 210 or other supporting structure which couples to the indexer 208. Alternatively, the side storage pod chamber 121 may directly couple to the indexer 208. The indexer 208 may be any suitable lift and lower mechanism for providing vertical motion of the side storage pod chamber 121. For example, the indexer 208 may include a linear bearing assembly 212 including a bearing slide, rail, etc., (not shown). The linear bearing assembly 212 may couple to a vertical actuator 214. Actuation of the vertical actuator 214 causes raising or lowering of the side storage pod chamber 121. Vertical actuator 214 may be any suitable actuator type, such as hydraulic, pneumatic, electrical, or the like.

Figure 2B:
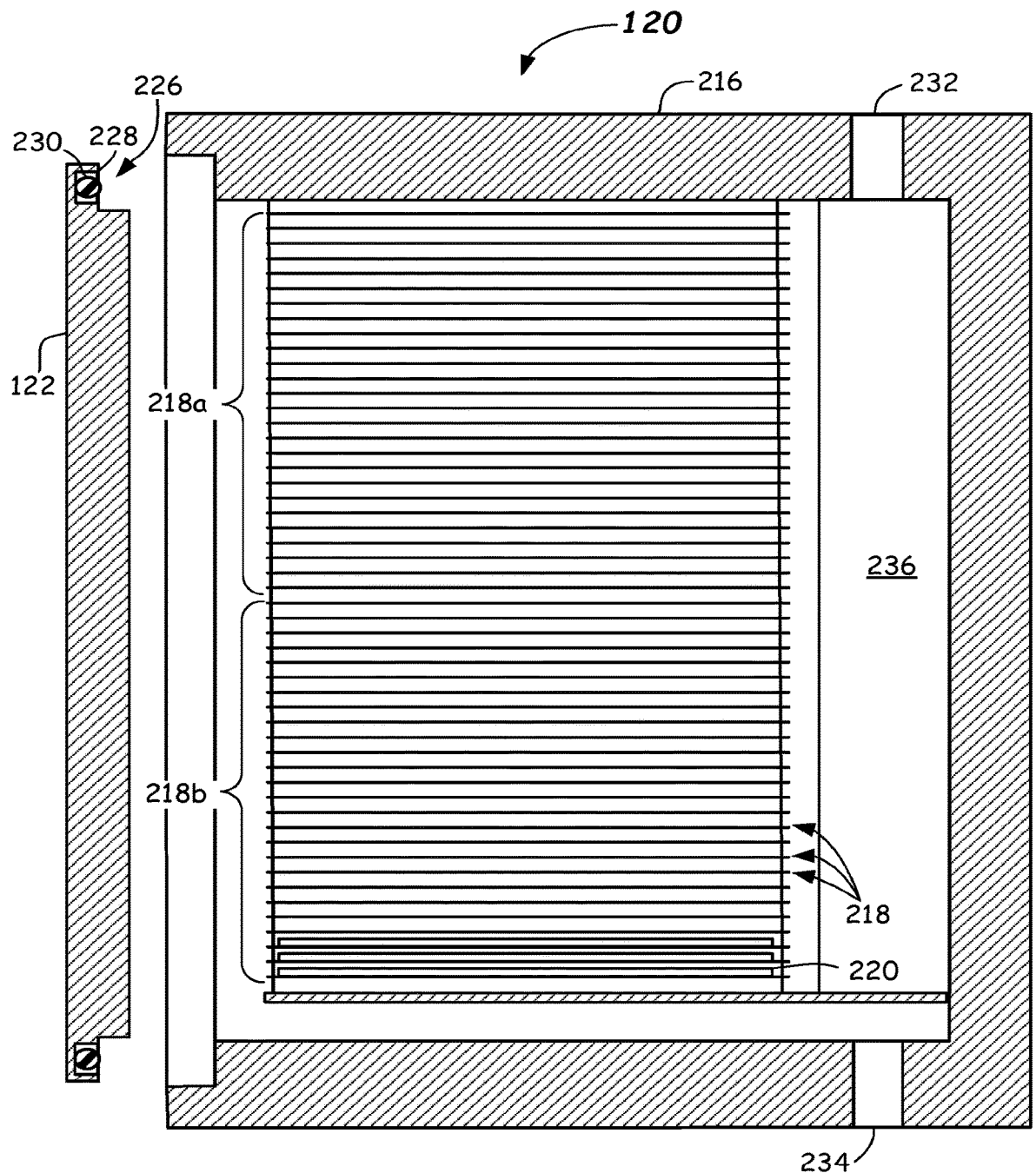

The side storage pod chamber 121 includes a body 216 with a plurality of vertically-spaced storage members 218 each configured to support a substrate 220 (FIG. 2B). The vertically-spaced storage members 218 may be shelves or other supporting structures coupled to the body 216 of the side storage pod chamber 121 for supporting substrates. The vertically-spaced storage members 218 may be spaced apart a sufficient distance to allow a robot blade 222 (FIG. 2A) of robot 117 (FIG. 1A) of EFEM 114 to load substrates onto or remove substrates from the vertically-spaced storage members 218.

In some embodiments, the side storage pod chamber 121 may include at least 50 substrate storage members 218, in some embodiments at least 52 substrate storage members 218, and in some embodiments at least 75 or more substrate storage members 218. Other numbers of substrate storage members may be used. In some embodiments, the storage members 218 may include multiple sub-groups of 25 or 26 substrate storage members 218 and the indexer 208 may be operable to vertically move the side storage pod chamber 121 so that different 25 or 26 substrate subgroups of storage members are accessible by a robot blade 222 of robot 117 of EFEM 114. For example, as shown in FIGS. 2B, 2E and 2F, a first subgroup 218a of storage members 218 may be positioned for access by robot blade 222 of robot 117 of EFEM 114 and at a later time the indexer 208 may lower the side storage pod chamber 121 to allow the robot blade 222 of robot 117 of EFEM 114 to access the second subgroup 218b of storage members 218, or vice versa.

The side storage pod chamber 121 includes removable door 122 that allows robot 117 of the EFEM 114 to access the plurality of storage members 218 when the removable door 122 is removed. As shown in FIG. 2B, the removable door 122 (and/or the body 216 of the side storage pod chamber 121) may include a sealing surface 226 having a groove 228 and sealing member 230 that allows the door 122 to seal relative to the body 216 of the side storage pod chamber 121. This allows the environment within the side storage pod chamber 121 to be isolated from the environment of outer enclosure 202 of side storage pod 120 and/or from the environment of EFEM 114.

In some embodiments, the side storage pod chamber 121 may include a purge gas supply inlet 232 and an exhaust outlet 234 that allows an inert and/or non-reactive gas, such as a heated, non-reactive gas, to flow through the side storage pod chamber 121, over any substrates stored therein, and out of the side storage pod chamber 121. This allows any volatile byproducts present within the side storage pod chamber 121 or located on substrates stored with the side storage pod chamber 121 to be removed using one or more pump/purge cycles, and may reduce cross contamination between the side storage pod chamber 121 and the EFEM 114 during substrate transfers therebetween. Example inert and/or non-reactive gases include argon, $N_2$, helium, any other suitable gas or mixtures thereof. Heater 123 (FIG. 1A) may be used to heat a gas before entry into the side storage pod chamber 121, for example. In some embodiments, the exhaust outlet 234 may be vented outside of EFEM 114 (see, FIG. 2A, for example).

Figure 2C:
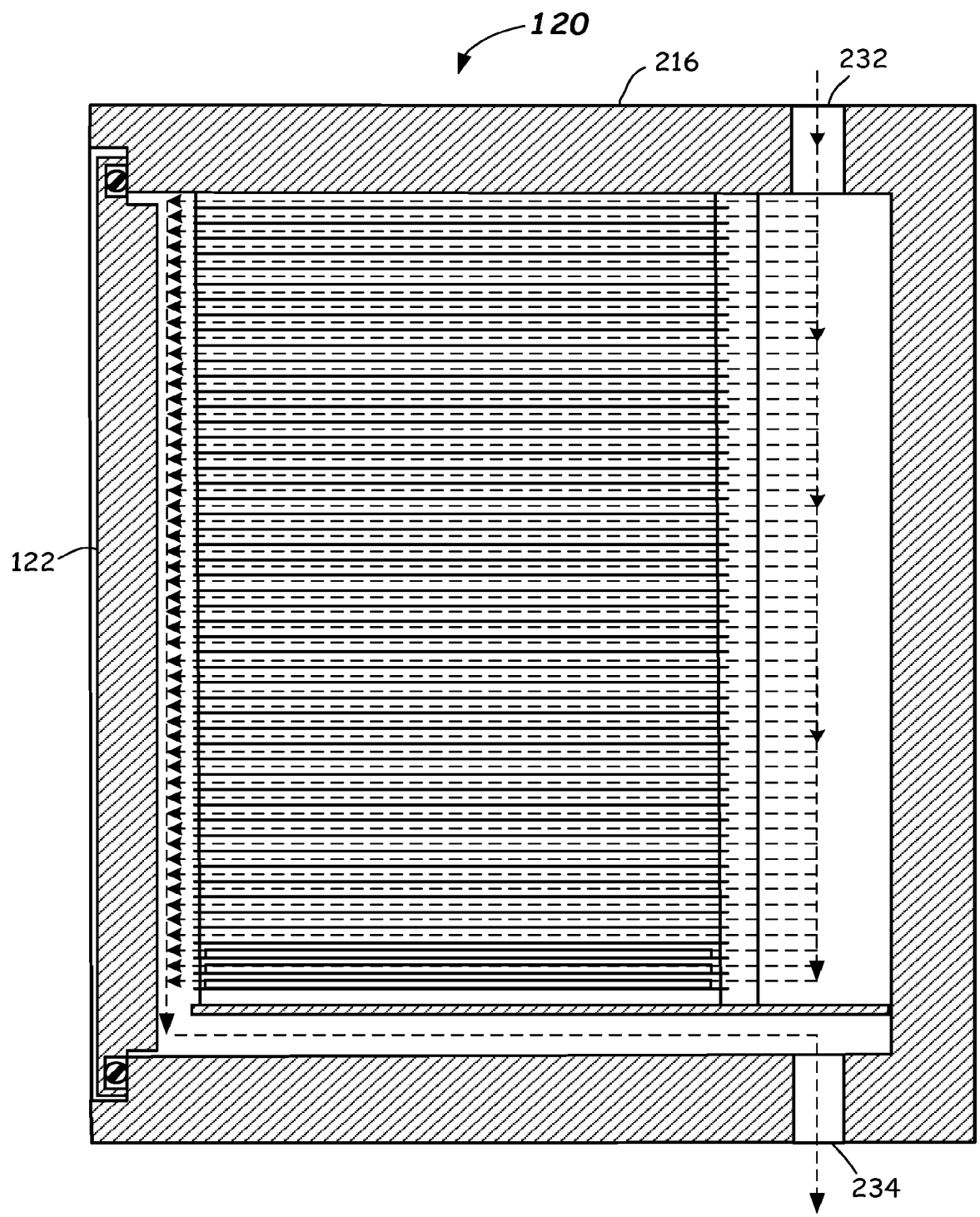

As shown in FIGS. 2B and 2C, in one or more embodiments, the side storage pod chamber 121 may include a gas distribution system 236, such as a plenum, gas distribution plate, a hollow tube with an opening or nozzle at each storage member 218, or the like, that allows an inert and/or non-reactive gas supplied to the purge gas supply inlet 232 to be dispersed so as to travel across the vertically-spaced storage members 218 prior to exiting the exhaust outlet 234. In FIG. 2C, arrows show example gas flow through purge gas supply inlet 232, across storage members 218 (not labelled in FIG. 2C) toward side storage pod chamber door 122 and out exhaust outlet 234. Such an arrangement may improve contaminate removal during pump/purge cycles within the side storage pod chamber 121. Also, gas may be flowed through side storage pod chamber 121 when door 122 is removed to deter gas within EFEM chamber 114C from entering side storage pod chamber 121.

Because side storage pod chamber 121 may be sealed and provided its own environment separate from EFEM chamber 114C, in some embodiments, the side storage pod chamber 121 may be sealed and removed from the side storage pod 120 for use at another processing location (e.g., through access door 164 of FIG. 1B). Another side storage pod chamber then may be loaded into side storage pod 120 and used to transfer substrates to and/or receive substrates from EFEM 114. In this manner, an unlimited amount of substrate storage may be provided to EFEM 114 through the use of additional side storage pod chambers.

As illustrated in FIG. 2A, an opening 238 is provided in panel 160 between EFEM 114 and outer enclosure 202 of side storage pod 120. Opening 238 allows the area surrounding the side storage pod chamber 121 within the side storage pod 120 to share an environment with EFEM 114 when coupled to EFEM 114. In some embodiments, outer enclosure 202 may include a separate exhaust outlet (not shown). In one or more embodiments, an additional door (not shown) may be provided to seal the opening 238 and isolate side storage pod 120 from EFEM 114.

In the embodiment of FIG. 2A, side storage pod 120 and/or EFEM 114 include a side storage pod chamber door opener 240 that may remove the door 122 of side storage pod chamber 121 to provide access to storage members 218 and/or any substrates 220 stored thereon. Side storage pod chamber door opener 240 may have one or more connectors (not show) attached to a connector plate 242 configured to contact and attach to door 122 of side storage pod chamber 121. The connectors may be, e.g., suction type devices, vacuum devices, etc. Other suitable types of connector devices capable of attaching to and holding side storage pod chamber door 122 may be used. A locking mechanism (not shown) may be used to lock door 122 so door 122 does not open unintentionally, and connector plate 242 may include a suitable unlocking mechanism (not shown).

Door opener 240 may include, for example, a linear slide 244 and drive system 246 that allows retraction of the connector plate 242 and door 122 from the side storage pod chamber 121 or movement of the connector plate 242 and door 122 toward the side storage pod chamber 121. Drive system 246 may include a suitable motor and transmission mechanism to cause motion toward and away from the side storage pod chamber 121. Any suitable type of door unlock and grasp mechanism may be used to grasp and open the side storage pod chamber door 122.

Lowering of the door 122 may be accomplished by an elevator 248. Elevator 248 may include any suitable mechanism for providing vertical motion of the connector plate 242 and side storage pod chamber door 122. For example, the elevator 248 may include a linear bearing assembly 250 including a bearing slide, rail, etc. (not shown). The linear bearing assembly 250 may couple to a vertical actuator (not separately shown) located within the drive system 246, for example. Actuation of the vertical actuator causes raising or lowering of the connector plate 242 and the door 122 of the side storage pod chamber 121 if the door 122 has been removed from the side storage pod chamber 121 by the door opener 240. Any suitable vertical actuator type may be used, such as hydraulic, pneumatic, electrical, or the like.

In operation, side storage pod chamber 121 may be loaded into storage pod 120 through access door 164 (FIG. 1). In the embodiment of FIG. 2A, side storage pod chamber 121 is positioned on pedestal 210, which in some embodiments may have one or more registration features (not shown) that provide alignment of the side storage pod chamber 121 within side storage pod 120.

Once loaded within side storage pod 120, an inert and/or non-reactive gas such as $N_2$, Ar, etc., may be used to provide a non-reactive environment within side storage pod chamber 121, to pump/purge side storage pod chamber 121, etc. For example, a heat gas such as $N_2$ may be flowed through inlet 232 of side storage pod chamber 121, over any substrates stored therein, and out of exhaust outlet 234 of side storage pod chamber 121. In some embodiments, the environment within side storage pod chamber 121 may have a different (e.g., greater) level of purity than the environment within EFEM 114.

Figure 2D:
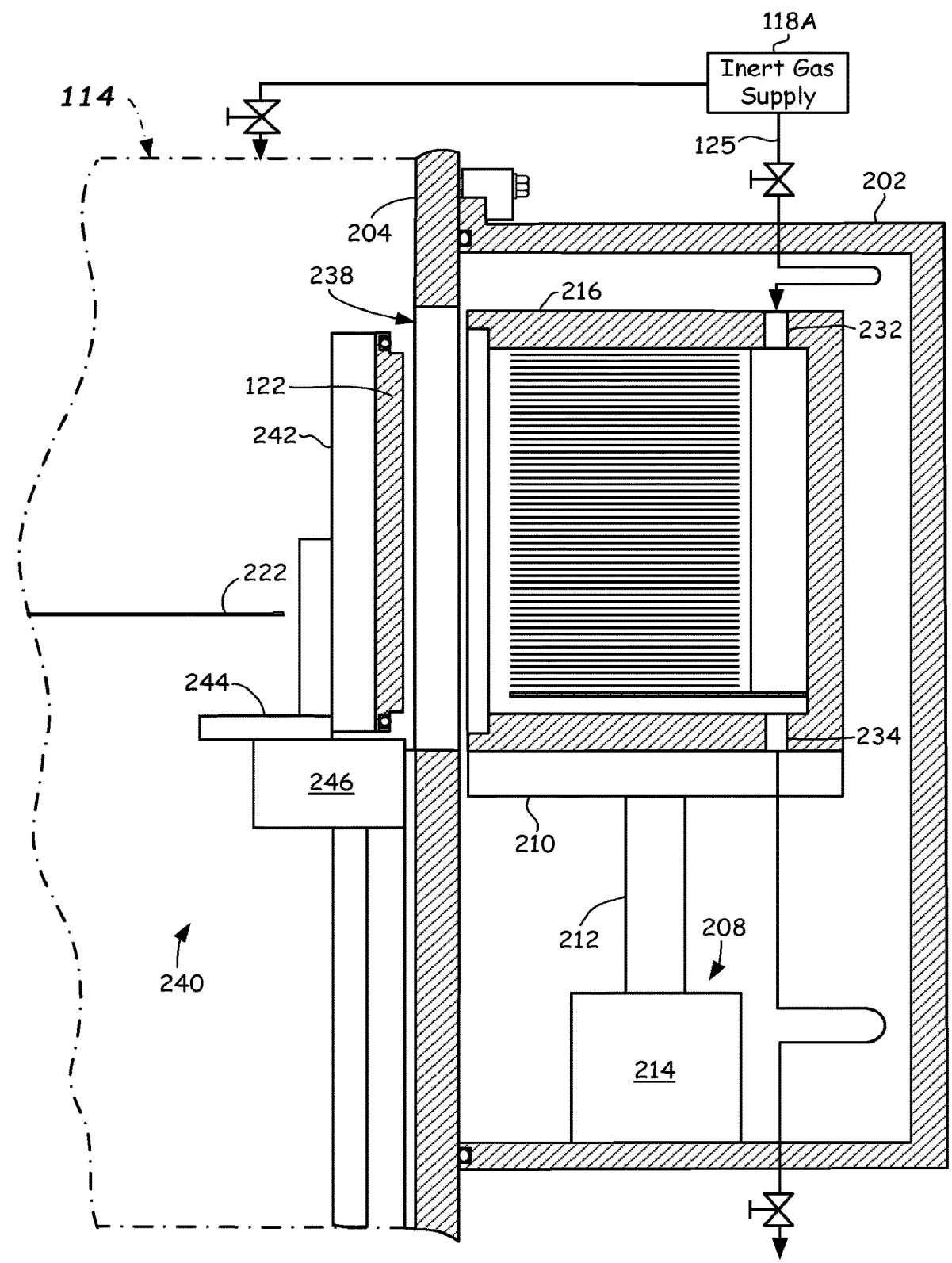
Figure 2E:
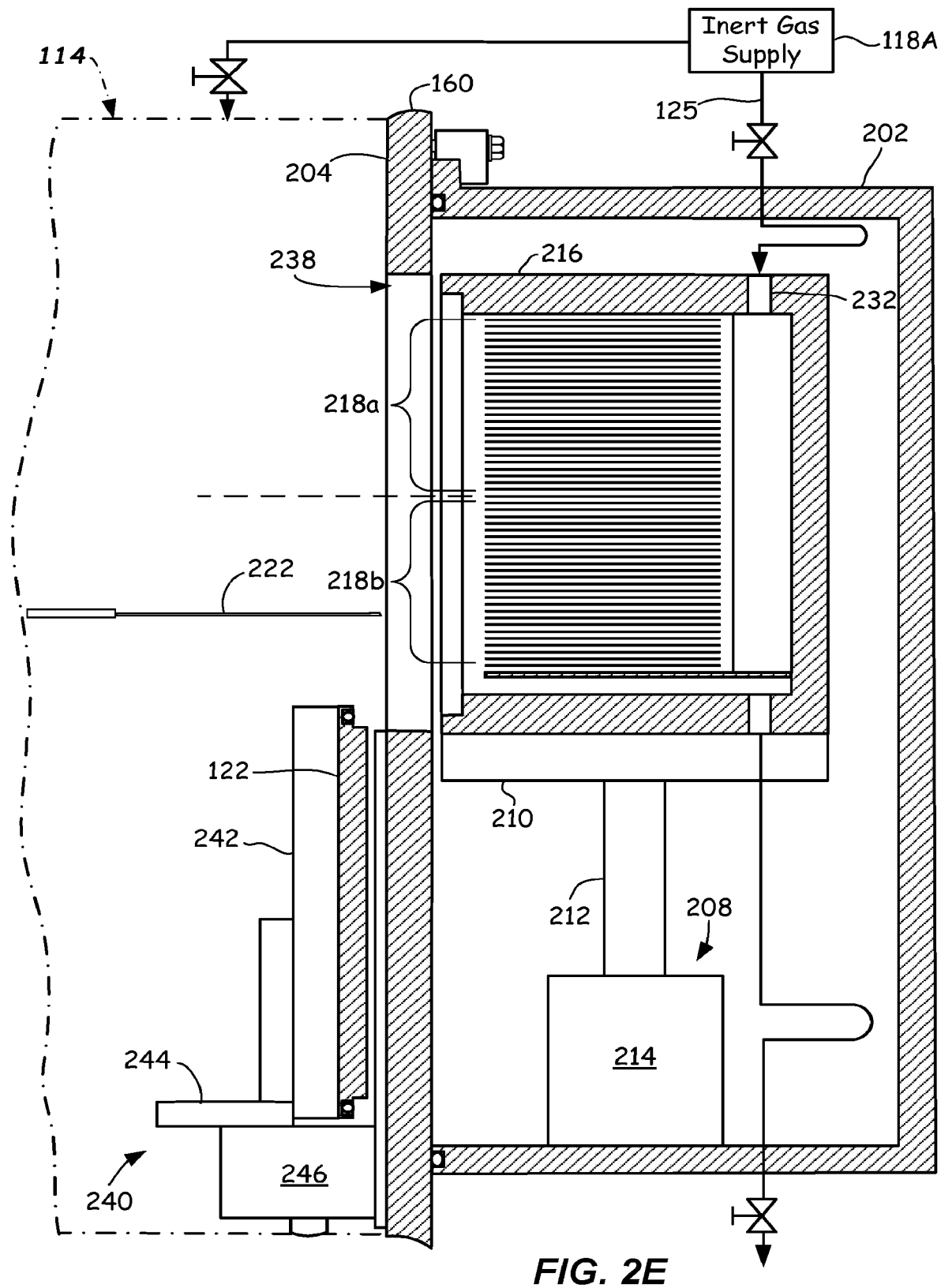
Figure 2F:
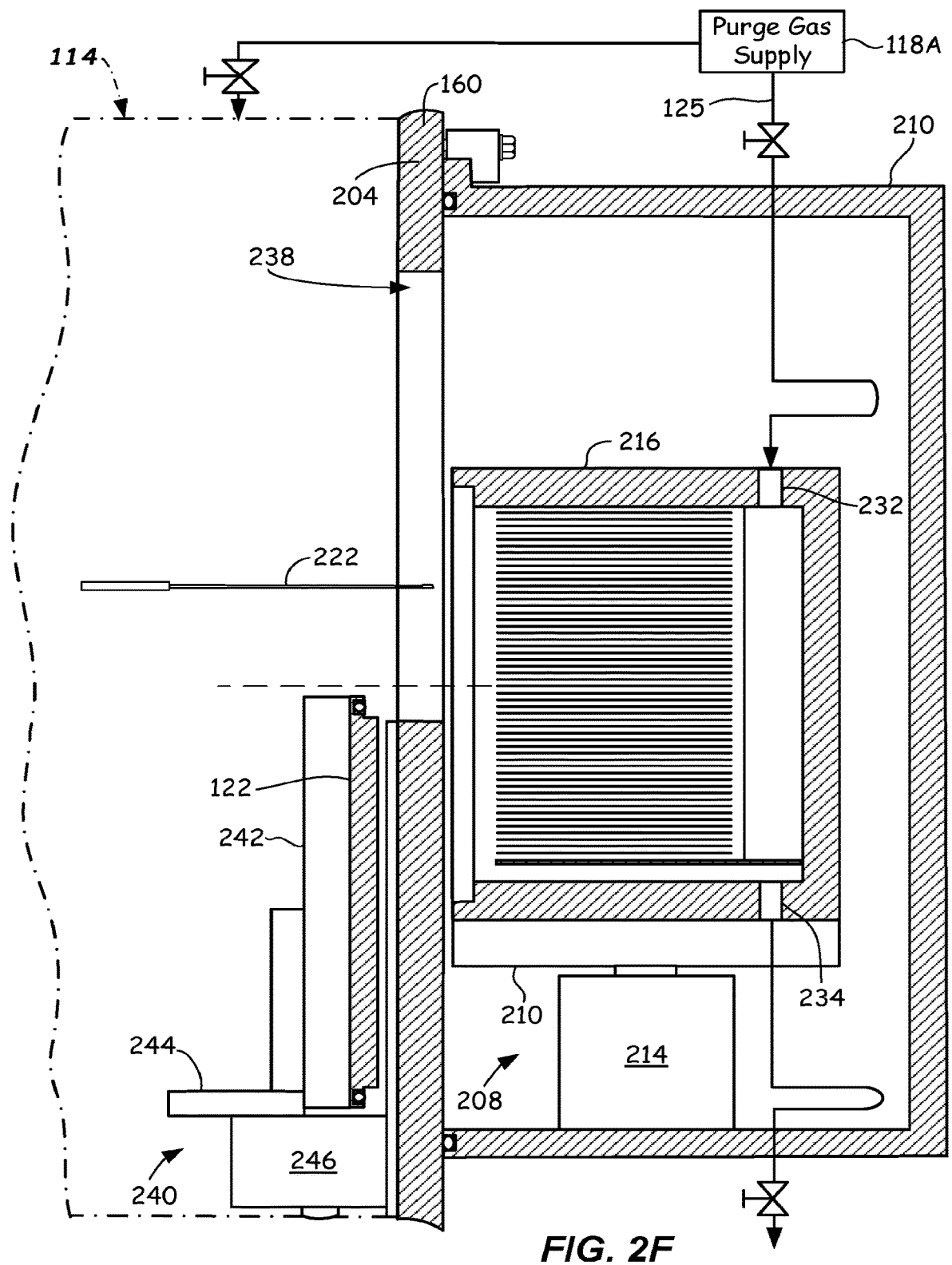

Door opener 240 may be used to open side storage pod chamber 121 to access storage members 218 and/or any substrates stored thereon. For example, connector plate 242 may contact, engage, unlock and/or remove door 122 of side storage pod chamber 121 and retract door 122 away from side storage pod chamber 121 using linear slide 244 and drive system 246 as illustrated in FIG. 2D. Thereafter, door 122 may be lowered using linear bearing assembly 250 and drive system 246, for example, as shown in FIG. 2E.

With door 122 out of the way of opening 238, robot blade 222 of robot 117 of EFEM 114 may store substrates within or remove substrates from side storage pod chamber 121. In the embodiment shown in FIG. 2E, robot blade 222 may access the lower subgroup 218b of storage members 218. Alternatively, indexer 208 may lower side storage pod chamber 121 as shown in FIG. 2F to access the upper subgroup 218a of storage members 218.

In some embodiments, during opening of door 122 of side storage pod chamber 121 and/or during loading of a substrate into or removal of a substrate from side storage pod chamber 121, a purge gas, such as an inert and/or non-reactive gas, may be flowed through side storage pod chamber 121 using gas distribution system 236 to inhibit the environment from EFEM 114 from entering side storage pod chamber 121 and potentially contaminating any substrates stored therein. For example, a higher pressure may be maintained in side storage pod chamber 121 than in EFEM 114 in some embodiments.

Side storage pod chamber 121 may remain open while multiple substrates are loaded into or removed from side storage pod chamber 121, or may be closed following any substrate transfer operation to or from side storage pod chamber 121.

In some embodiments, robot blade 222 of robot 117 of EFEM 114 may use no vertical motion to transfer substrates to and from side storage pod chamber 121. Any vertical motion for substrate transfers may be provided by indexer 208. Alternatively, robot blade 222 of EFEM 114 may provide some vertical motion. In yet other embodiments, robot blade 222 may access all storage members 218 of side storage pod chamber 121 without using indexer 208 by using vertical motion of the robot blade 222.

As mentioned, side storage pod chamber 121 may be removed from side storage pod 120. This allows for easy maintenance and cleaning of side storage pod chamber 121 and the ability to quickly add more storage to EFEM 114.

Figure 3:
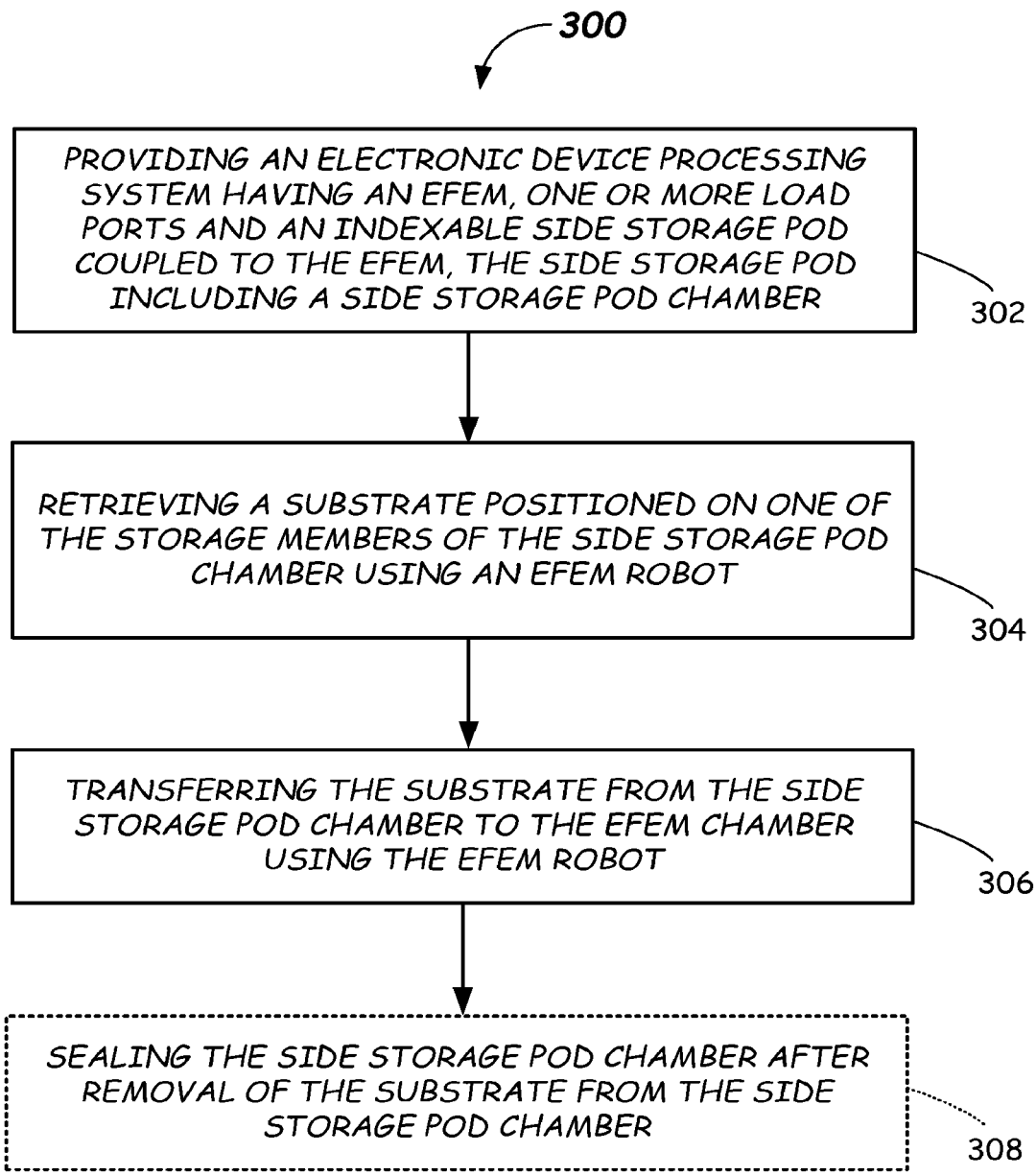
FIG. 3 illustrates a flowchart depicting a method of unloading substrates from a side storage pod within an electronic device processing system according to one or more embodiments.

FIG. 3 illustrates a method 300 of processing substrates within an electronic device processing system in accordance with embodiments provided herein. With reference to FIG. 3, in Block 302, method 300 includes providing an electronic device processing system that includes an equipment front end module having an equipment front end module chamber, one or more load ports coupled to a front of the equipment front end module, each load port configured to support a substrate carrier, and an indexable side storage pod coupled to a side of the equipment front end module.

For example, FIG. 1A illustrates electronic device processing system 100 which includes EFEM 114 with EFEM chamber 114C, load ports 115 supporting substrate carriers 116, and indexable side storage pod 120 (e.g., side storage pod chamber 121 within side storage pod 120 may be raised or lowered). In some embodiments, the side storage pod 120 includes outer enclosure 202 having a sealing surface 168 configured to couple to EFEM 114. A side storage pod chamber 121 having a body 216 with a plurality of vertically-spaced storage members 218 (each configured to support a substrate) may be provided within the side storage pod 120. The side storage pod 120 may include an indexer 208 operable to vertically move the side storage pod chamber 121 so that different subgroups of storage members 218 are accessible by a load-unload robot 117 in the EFEM 114.

In Block 304, the method 300 includes retrieving a substrate positioned on one of the storage members of the side storage pod chamber using a robot within the equipment front end module. For example, door 122 of side storage pod chamber 121 may be removed using door opener 240 and lowered to provide access to storage members 218. A substrate (e.g., substrate 220 in FIG. 2B) positioned on one of the storage members 218 of the side storage pod chamber 121 then may be retrieved using robot blade 222 of robot 117 within the EFEM 114. In one or more embodiments, a purge gas may be flowed through side storage pod chamber 121 while door 122 is removed.

In some embodiments, storage members 218 may include multiple sub-groups of 25 or 26 substrate storage members and indexer 208 may be used to vertically move side storage pod chamber 121 so that different 25 or 26 substrate sub-groups of storage members are accessible by robot blade 222 of the EFEM 114.

In Block 306, the method 300 includes transferring the substrate from the side storage pod chamber to the equipment front end module chamber using the robot. For example, a substrate 220 may be removed from side storage pod chamber 121 using robot blade 222 of robot 117 of EFEM 114, and transferred to EFEM chamber 114C (FIG. 2E). Retrieving the substrate 220 may include using indexer 208 to position side storage pod chamber 121 at the appropriate height for robot blade 222, for example.

In some embodiments, in Block 308, the method 300 includes sealing the side storage pod chamber after removal of the substrate from the side storage pod chamber. For example, after transferring a substrate from side storage pod chamber 121 to EFEM chamber 114C, the door opener 240 may raise and move door 122 back against side storage pod chamber 121.

Figure 4:
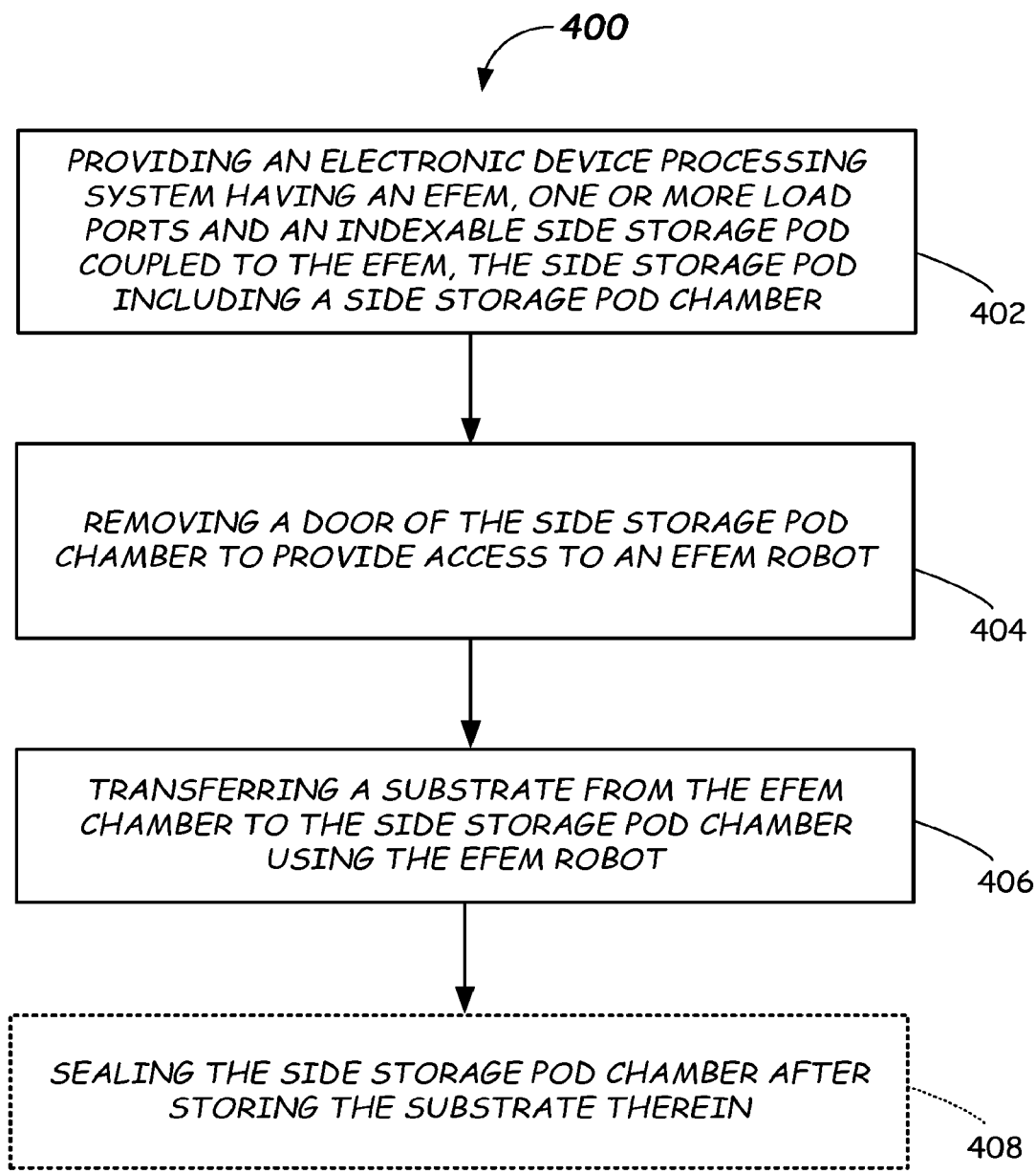
FIG. 4 illustrates a flowchart depicting a method of loading substrates into a side storage pod within an electronic device processing system according to one or more embodiments.

A similar method may be used to store substrates within side storage pod 120. For example, FIG. 4 illustrates a method 400 of storing substrates in a side storage pod. With reference to FIG. 4, Block 402 includes providing an electronic device processing system having an EFEM, one or more load ports and an indexable side storage pod, the side storage pod including a side storage pod chamber. Block 404 includes removing a door of the side storage pod chamber to provide access to an EFEM robot. Block 406 includes transferring a substrate from the EFEM chamber to the side storage pod chamber using the EFEM robot. This may include flowing a purge gas through the side storage pod chamber during removal of the side storage pod chamber door and/or during the substrate transfer operation, and/or indexing the side storage pod chamber (e.g., raising or lowering the side storage pod chamber). In some embodiments, the side storage pod chamber may be sealed after the substrate is stored therein (Block 408).

Controller 106 (FIG. 1A) may control environmental conditions to meet environmental preconditions via an environmental control system 118. For example, controlling environmental conditions to meet environmental preconditions within substrate carriers and/or side storage pod chamber 121 may take place before opening any one of the one or more substrate carrier doors or door 122 of side storage pod chamber 121. The environmental conditions in EFEM 114 may also be controlled to meet environmental preconditions before allowing the opening of any one of the one or more substrate carrier doors, door 122 of side storage pod chamber 121, or any one of the one or more load lock chambers.

The foregoing description provides example embodiments of the disclosure. Accordingly, while the present disclosure has been provided in connection with example embodiments, it should be understood that other embodiments and equivalents may fall within the scope of the disclosure, as defined by the following claims.

What is claimed is:

1. A side storage pod of an equipment front end module (EFEM), the side storage pod comprising:
an outer enclosure having a sealing surface configured to couple to the EFEM;
a side storage pod chamber having a body coupled to a plurality of vertically-spaced storage members, wherein each of the plurality of vertically-spaced storage members is configured to support a corresponding substrate within the body; and
a door, wherein the door and the body are to seal relative to each other responsive to the door being in a closed position, wherein a load-unload robot of the EFEM is to access the plurality of vertically-spaced storage members responsive to the door being in an open position, wherein an environment within the side storage pod chamber is to be controlled to be one or more of: at first environmental conditions responsive to the door being in the closed position; or at second environmental conditions responsive to the door being in the open position.

2. The side storage pod of claim 1, wherein a supply of gas is to be provided to the side storage pod chamber prior to the door being in the open position to purge the side storage pod chamber.

3. The side storage pod of claim 1, wherein a supply of gas is to be provided to the side storage pod chamber responsive to the door being in the open position to deter gas from within the EFEM from entering the side storage pod chamber.

4. The side storage pod of claim 1, wherein controlling the environment within the side storage pod chamber comprises controlling one or more of relative humidity, temperature, amount of oxygen, an amount of inert gas, or an amount of non-reactive gas.

5. The side storage pod of claim 1, wherein controlling the environment within the side storage pod chamber comprises controlling one or more of gas flow rate into the side storage pod chamber or pressure in the side storage pod chamber.

6. The side storage pod of claim 1, wherein the side storage pod comprises a controller and sensors to monitor and control the environment within the side storage pod chamber.

7. The side storage pod of claim 1, wherein a robot blade of the load-unload robot is to be moved vertically to access the plurality of vertically-spaced storage members responsive to the door being in the open position.

8. The side storage pod of claim 1 further comprising an indexer operable to vertically move the side storage pod chamber to provide access to different subgroups of the plurality of vertically-spaced storage members by the load-unload robot in the EFEM.

9. The side storage pod of claim 1 further comprising an exhaust outlet.

10. An electronic device processing system comprising:
an equipment front end module (EFEM) comprising an EFEM chamber;
one or more load ports coupled to a front of the EFEM, wherein each of the one or more load ports is configured to support a substrate carrier; and
a side storage pod coupled to a side of the EFEM, the side storage pod comprising:
an outer enclosure having a sealing surface configured to couple to the EFEM;
a side storage pod chamber having a body coupled to a plurality of vertically-spaced storage members, wherein each of the plurality of vertically-spaced storage members is configured to support a corresponding substrate within the body; and
a door, wherein the door and the body are to seal relative to each other responsive to the door being in a closed position, wherein a load-unload robot of the EFEM is to access the plurality of vertically-spaced storage members responsive to the door being in an open position, wherein an environment within the side storage pod chamber is to be controlled to be one or more of: at first environmental conditions responsive to the door being in the closed position; or at second environmental conditions responsive to the door being in the open position.

11. The electronic device processing system of claim 10, wherein a supply of gas is to be provided to the side storage pod chamber prior to the door being in the open position to purge the side storage pod chamber.

12. The electronic device processing system of claim 10, wherein a supply of gas is to be provided to the side storage pod chamber responsive to the door being in the open position to deter gas from within the EFEM chamber from entering the side storage pod chamber.

13. The electronic device processing system of claim 10, wherein controlling the environment within the side storage pod chamber comprises controlling one or more of relative humidity, temperature, amount of oxygen, an amount of inert gas, or an amount of non-reactive gas.

14. The electronic device processing system of claim 10, wherein controlling the environment within the side storage pod chamber comprises controlling one or more of gas flow rate into the side storage pod chamber or pressure in the side storage pod chamber.

15. The electronic device processing system of claim 10, wherein the side storage pod comprises a controller and sensors to monitor and control the environment within the side storage pod chamber.

16. The electronic device processing system of claim 10, wherein a robot blade of the load-unload robot is to be moved vertically to access the plurality of vertically-spaced storage members responsive to the door being in the open position.

17. The electronic device processing system of claim 10, wherein the side storage pod further comprises an indexer operable to vertically move the side storage pod chamber to provide access to different subgroups of the plurality of vertically-spaced storage members by the load-unload robot in the EFEM.

18. A method for transferring substrates in an electronic device processing system, the method comprising:
  causing a door of a side storage pod to be in an open position, wherein the side storage pod is coupled to a side of an equipment front end module (EFEM), wherein one or more load ports are coupled to a front of the EFEM, wherein each of the one or more load ports is configured to support a substrate carrier, wherein the side storage pod comprises an outer enclosure having a sealing surface configured to couple to the EFEM, wherein the side storage pod comprises a side storage pod chamber having a body coupled to a plurality of vertically-spaced storage members, wherein each of the plurality of vertically-spaced storage members is configured to support a corresponding substrate within the body;
  controlling environment within the side storage pod chamber to be one or more of: at first environmental conditions responsive to the door being in a closed position; or at second environmental conditions responsive to the door being in the open position;
  responsive to the door being in the open position, retrieving, using a load-unload robot of the EFEM, a substrate positioned on a first vertically-spaced storage member of the plurality of vertically-spaced storage members of the side storage pod chamber, wherein the door and the body of the side storage pod are to seal relative to each other responsive to the door being in the closed position; and
  transferring, using the load-unload robot, the substrate from the side storage pod chamber to an EFEM chamber of the EFEM.

19. The method of claim 18, wherein the controlling of the environment comprises providing a supply of gas to the side storage pod chamber prior to the door being in the open position to purge the side storage pod chamber.

20. The method of claim 18, wherein the controlling of the environment comprises providing a supply of gas to the side storage pod chamber responsive to the door being in the open position to deter gas from within the EFEM chamber from entering the side storage pod chamber.

21. The method of claim 18, wherein the controlling of the environment comprises controlling one or more of relative humidity, temperature, amount of oxygen, an amount of inert gas, or an amount of non-reactive gas.

22. The method of claim 18, wherein the controlling of the environment comprises controlling one or more of gas flow rate into the side storage pod chamber, or pressure in the side storage pod chamber.

23. The method of claim 18 further comprising monitoring and controlling, using a controller and sensors, the environment within the side storage pod chamber.

24. The method of claim 18, wherein the side storage pod further comprises an indexer operable to vertically move the side storage pod chamber to provide access to different subgroups of the plurality of vertically-spaced storage members by the load-unload robot of the EFEM.

* * * * *